(12) United States Patent
Ji

(10) Patent No.: US 6,806,790 B2
(45) Date of Patent: *Oct. 19, 2004

(54) MINIATURE 180 DEGREE POWER SPLITTER

(75) Inventor: Daxiong Ji, Brooklyn, NY (US)

(73) Assignee: Scientific Components, Inc., Brooklyn, NY (US)

( * ) Notice: Subject to any disclaimer, the term of this patent is extended or adjusted under 35 U.S.C. 154(b) by 6 days.

This patent is subject to a terminal disclaimer.

(21) Appl. No.: 10/208,589

(22) Filed: Jul. 31, 2002

(65) Prior Publication Data

US 2003/0155991 A1 Aug. 21, 2003

Related U.S. Application Data

(60) Provisional application No. 60/357,322, filed on Feb. 19, 2002.

(51) Int. Cl.[7] .................................................. H04B 1/52
(52) U.S. Cl. ........................ 333/119; 333/25; 333/118; 333/124; 333/131
(58) Field of Search ........................ 333/25, 118–119, 333/124, 131

(56) References Cited

U.S. PATENT DOCUMENTS

| | | | | |
|---|---|---|---|---|
| 3,500,252 A | * | 3/1970 | Wakker | 333/131 |
| 3,673,517 A | * | 6/1972 | Ticknor | 333/131 |
| 4,275,365 A | * | 6/1981 | Ando | 333/131 |
| 4,516,092 A | * | 5/1985 | Rosenberg | 333/184 |
| 4,789,845 A | * | 12/1988 | Reddy | 333/100 |
| 5,006,822 A | * | 4/1991 | Reddy | 333/112 |
| 5,097,234 A | * | 3/1992 | Andresen | 333/119 |
| 5,218,322 A | * | 6/1993 | Allison et al. | 330/286 |
| 5,312,674 A | * | 5/1994 | Haertling et al. | 428/210 |
| 5,347,245 A | * | 9/1994 | Wright, Jr. | 333/131 |
| 5,532,667 A | * | 7/1996 | Haertling et al. | 336/177 |
| 5,661,647 A | * | 8/1997 | Washburn et al. | 363/147 |
| 6,114,924 A | * | 9/2000 | Cain et al. | 333/112 |
| 6,542,047 B2 | * | 4/2003 | Chen et al. | 333/119 |
| 6,578,202 B1 | * | 6/2003 | Holland | 725/127 |

* cited by examiner

Primary Examiner—Michael Tokar
Assistant Examiner—Khai Nguyen
(74) Attorney, Agent, or Firm—Kevin Redmond

(57) ABSTRACT

A power splitter that has a small package size and repeatable electrical characteristics. The power splitter includes a low temperature co-fired ceramic (LTTC) substrate with several layers. Electrical components such as resistors, capacitors and ground planes are integrated within the LTTC substrate. A binocular core transformer is attached to the upper surface of the LTTC substrate and is electrically connected to the resistors, capacitors and ground plane. The transformer provides impedance matching and dividing functions. The LTTC substrate has electrically conductive vias extending through the layers. The vias are used to connect the power splitter to terminals on outer surfaces of the substrate and to make electrical connections between the layers of the LTTC substrate. The power splitter circuit requires only one transformer.

11 Claims, 8 Drawing Sheets

MINIATURE 180 DEGREE POWER SPLITTER

This application claims priority to U.S. provisional patent application Ser. No. 60/357,322 filed on Feb. 19, 2002, which is herein incorporated by reference in entirety.

BACKGROUND

1. Field of the Invention

This invention relates to power splitters in general and more particularly to a two way 180 degree power splitter having a small package size.

2. Description of the Prior Art

Power splitters operating at frequencies below 1GHz have been made with ferrite transformers along with appropriate resistors and capacitors arranged around the ferrite transformer. These splitters provide multi-decade bandwidth. The power splitter components are packaged on a printed circuit board. In some applications, printed circuit board space can be extremely limited with additional space just not available. In some applications, it is desirable to build multiple output-port splitters such as 4-way and 8-way by cascading the splitters. Unfortunately, placing resistors and capacitors beside each transformer complicates the assembly program followed by the automated pick and place surface mount assembly equipment. This leads to lower production by the assembly machinery.

FIG. 1 shows a schematic of a prior art 2 way 180 degree power splitter circuit for frequencies of 1–750 MHz. Circuit 20 has transformers T1, T2, T3 and T4. Transformer T1 is connected between ground and an input terminal IN. Transformer T2 has one end connected to winding W1 of transformer T3 and the other end connected to winding W3 of transformer T4. The mid-points of transformers T1 and T2 are connected to ground through a capacitor C1. A resistor R1 is connected across transformer T2. Transformer T3 has a windings W1 and W2. Winding W1 is connected between transformer T2 and output terminal OUT2. Winding W2 has both ends connected to ground. Transformer T4 has windings W3 and W4. Winding W3 is connected between transformer T2 and ground. Winding W4 has one end connected to ground and the other end connected to output terminal OUT1. The circuit of FIG. 1 is a 2 way power splitter that provides an output signal that has 0 degrees of phase shift at terminal OUT2 and 180 degrees of phase shift at terminal OUT1. The circuit of FIG. 1 requires four transformers to perform the power splitting function.

While power splitters have been used, they have suffered from taking up excessive printed circuit board space and in having multiple transformers that add expense and complexity to manufacturing. A current unmet need exists for a power splitter that takes up less printed circuit board space with fewer components that can be easily assembled.

SUMMARY

It is a feature of the invention to provide a power splitter having a small package size that has repeatable electrical characteristics.

Another feature of the invention is to provide a power splitter that includes a substrate having several layers. The substrate has a first and a second outer surface. A resistor is formed on the first outer surface. A ground plane is formed on one of the layers. One or more capacitor electrodes are located on one of the layers. The capacitor electrodes form a capacitor. Several terminals are located on the first and second outer surfaces. A transformer is attached to the first outer surface and is electrically connected to the terminals, the resistor, the capacitor and the ground plane. The transformer provides impedance matching and dividing. Several vias extend between the layers to provide an electrical connection between the resistor, the capacitor, the terminals, the ground plane and the transformer.

Another feature of the invention is to provide a power splitter that takes up less printed circuit board space and has improved electrical repeatability.

A further object of the invention is to provide a method of manufacturing a 180 degree power splitter.

BRIEF DESCRIPTION OF THE DRAWINGS

In order that the invention may be more fully understood, it will now be described, by way of example, with reference to the accompanying drawings in which.

It is noted that the drawings of the invention are not to scale. In the drawings, like numbering represents like elements between the drawings.

DETAILED DESCRIPTION

Figure 1:
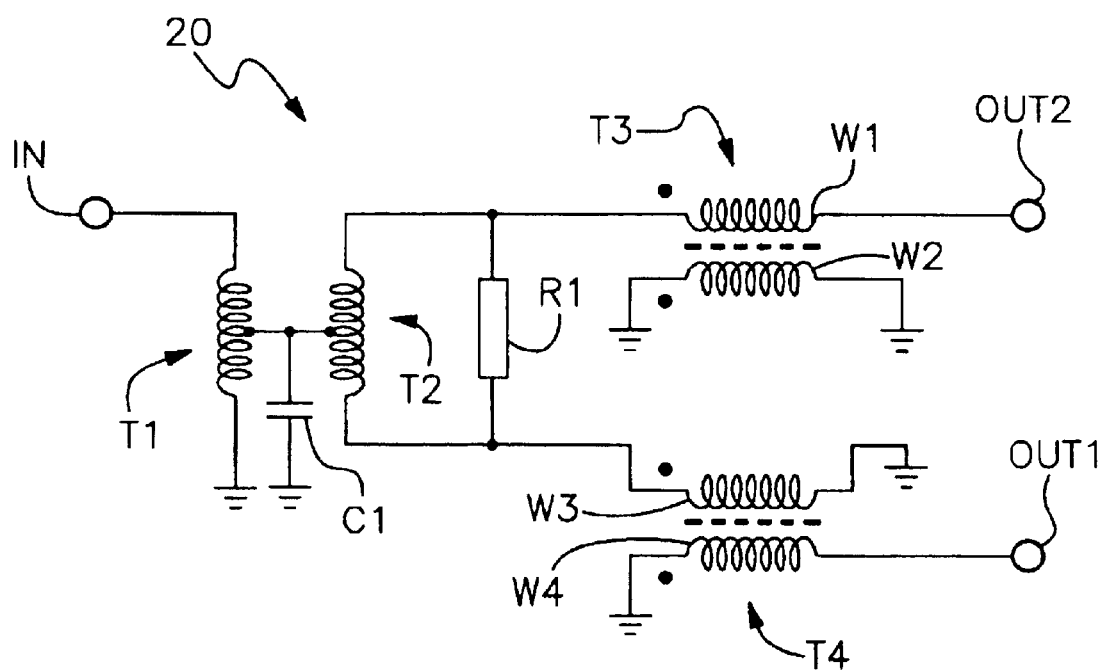
FIG. 1 is a schematic of a prior art power splitter.
Figure 2:
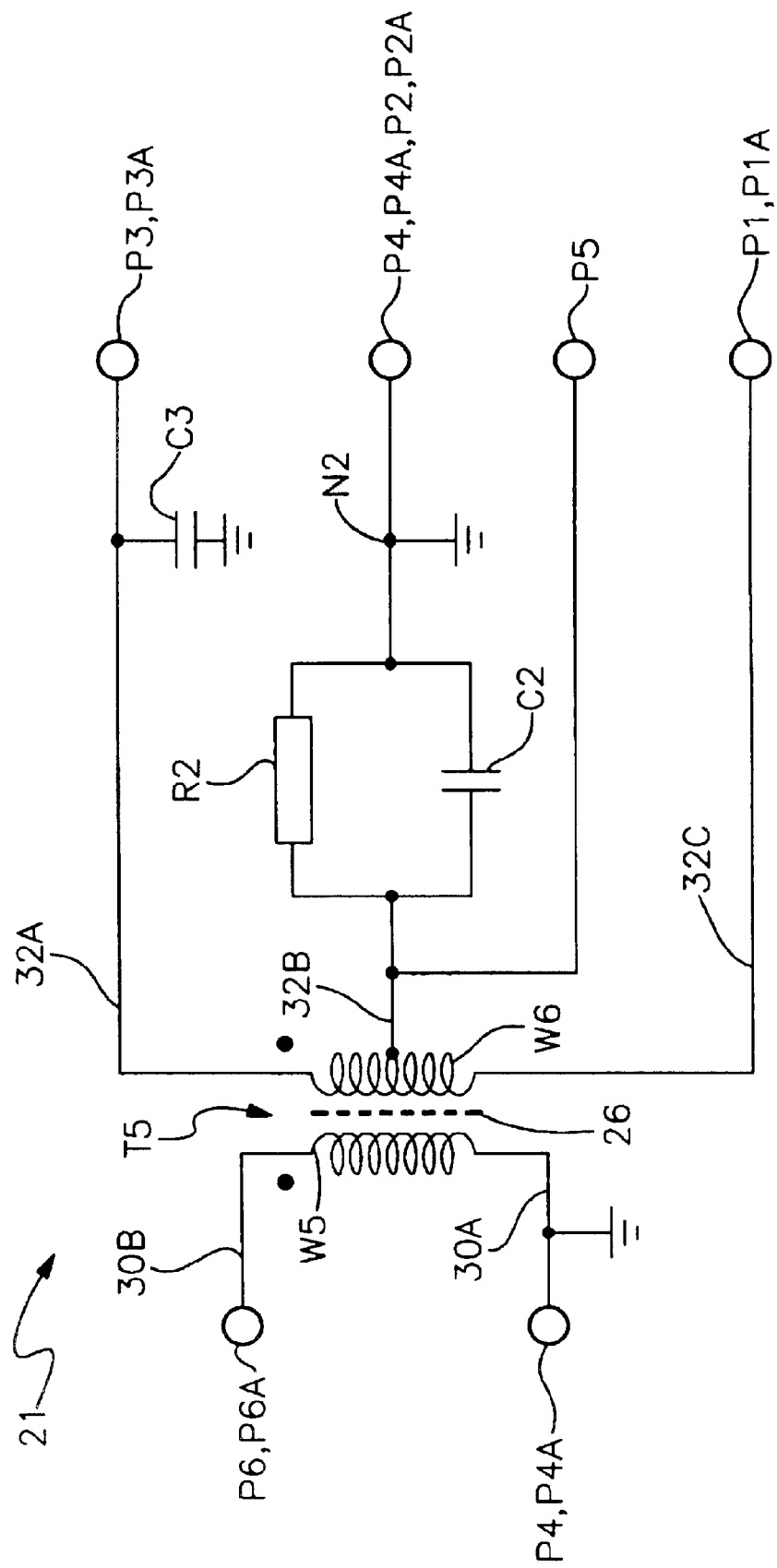
FIG. 2 a schematic of the power splitter of the present invention.

Referring to FIG. 2, a schematic of a 2-way 180 degree power splitter 21 in accordance with the present invention is shown. Power splitter 21 has a transformer T5. Transformer T5 has windings W5 and W6 wound on the center leg 26 of a binocular ferrite core. One end of winding W5 is connected to terminals P4, P4A and the other end is connected to input terminals P6, P6A. One end of winding W6 is connected to terminals P3, P3A and to ground through a capacitor C3. The other end is connected to output terminals P1, P1A. The mid-point of winding W6 at node N1 is connected to a parallel combination of resistor R2 and capacitor C2. Node N1 is also connected to terminal P5. A node N2 joins the other end of resistor R2 and capacitor C2. Node N2 is connected to terminals P4, P4A, P2, P2A and to ground.

Power splitter 21 provides an output signal that has 0 degrees of phase shift at terminal P3, P3A and 180 degrees of phase shift at terminal P1, P1A. Transformer T5 is a 1:2 transformer and matches the impedance at the input of the splitter to two outputs. In a 50 ohm system, resistor R2 has a value of 25 ohms. Resistor R2 provides isolation and impedance matching between output terminals P1, P1A and P3, P3A. The coupling of primary winding W5 to secondary winding W6 in transformer T5 is important for isolation and return loss. Capacitor C2 improves isolation and return losses at high frequencies. Capacitor C3 improves phase unbalance at high frequencies. Power splitter 21 is a 2-way power splitter since the input signal is split into two output signals. Power splitter 21 uses fewer transformers than the prior art circuits.

Figure 3:
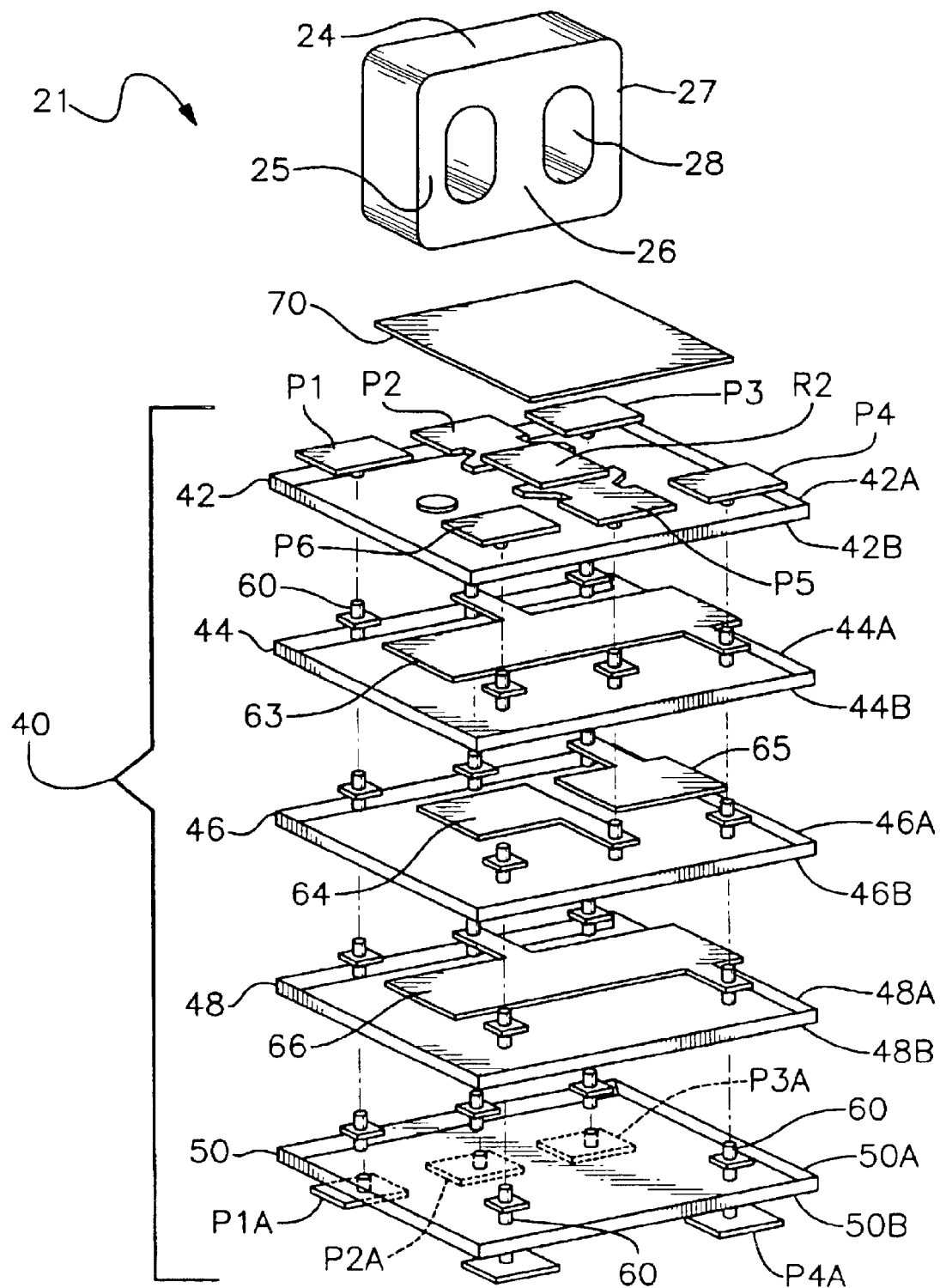
FIG. 3 is an exploded perspective view of the present invention.
Figure 4:
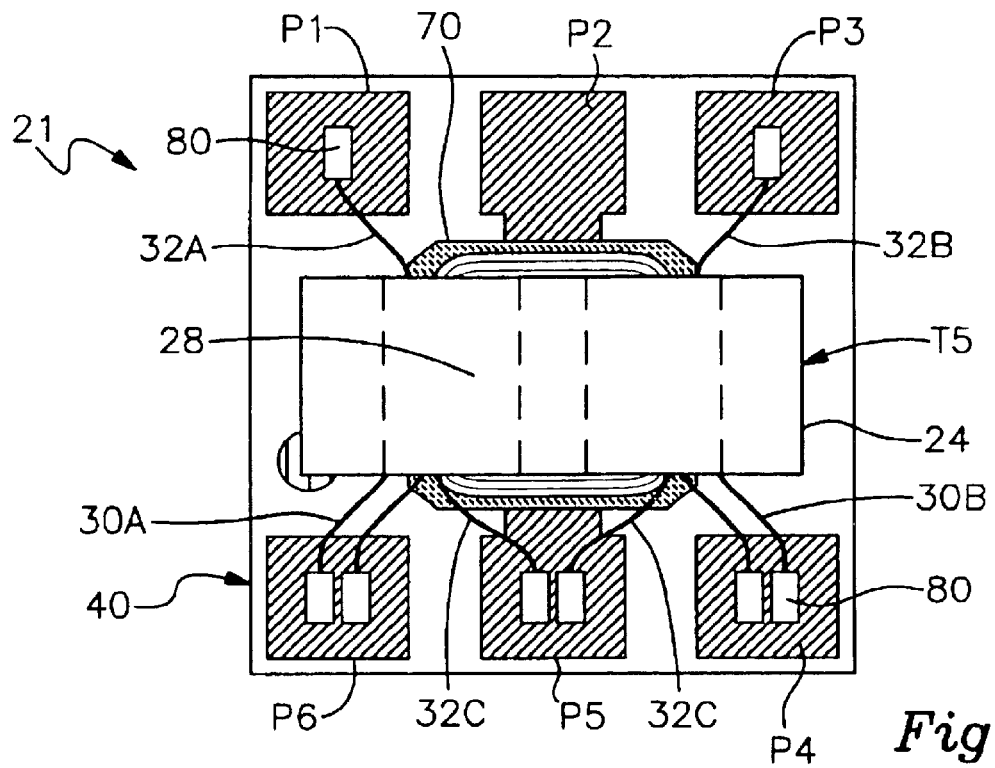
FIG. 4 is an assembled top view of FIG. 3.
Figure 5:
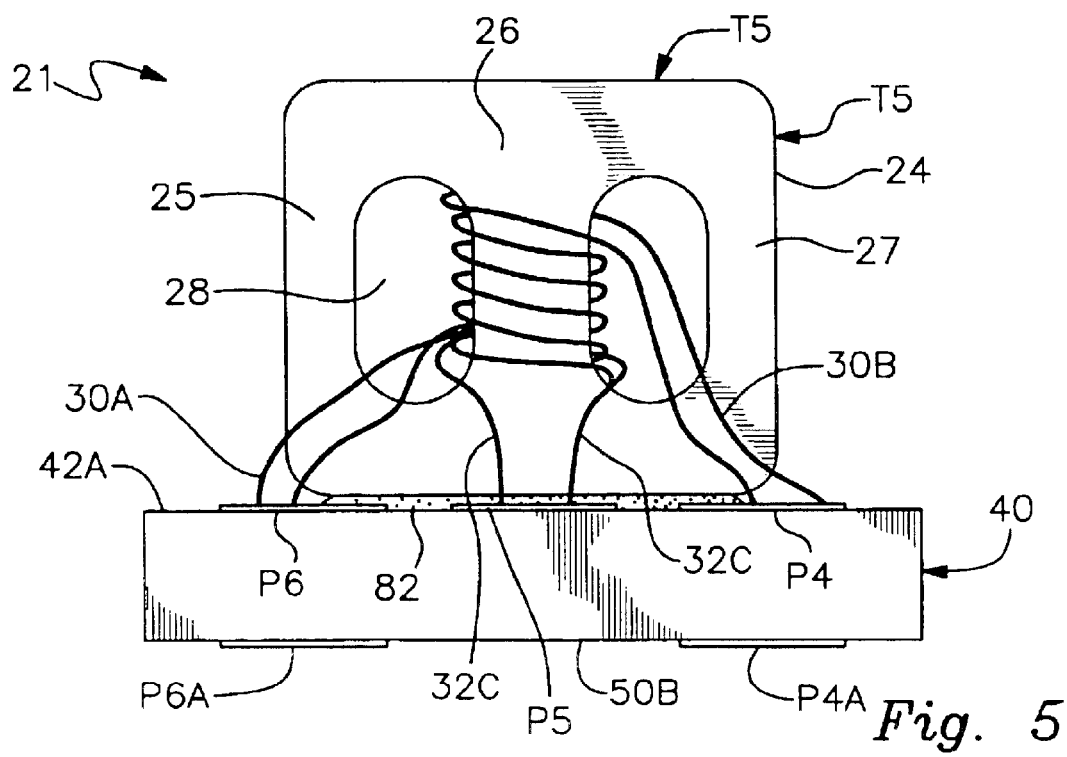
FIG. 5 is an assembled side view of FIG. 3.

Referring to FIGS. 3, 4 and 5, the physical implementation of power splitter 21 is shown. Power splitter 21 has a transformer T5. Transformer T5 has a ferrite binocular core 24 with three legs 25, 26 and 27 and a pair of holes 28. Windings W5 and W6 are wound around center leg 26. Winding W5 has wires 30A and 30B. Winding W6 has wires 32A, 32B and 32C. Transformer T5 performs the power splitting and matching functions.

Transformer T5 is mounted to a low temperature co-fired ceramic (LTCC) structure or substrate 40 using an epoxy 82. LTTC substrate 40 is comprised of multiple layers of LTCC material. Planar layers 42, 44, 46, 48 and 50 are all stacked on top of each other and form a unitary structure 40 after firing in an oven. LTCC layers 42–50 are commercially available in the form of a green unfired tape from Dupont Corporation. Each of the layers has a top surface, 42A, 44A, 46A, 48A and 50A Similarly, each of the layers has a bottom surface, 42B, 44B, 46B, 48B and 50B. The layers have several circuit features that are patterned on the top surfaces. Multiple vias 60 extend through each of the layers. Vias 60 are formed from an electrically conductive material and electrically connect one layer to another layer.

Layer 42 has several circuit features that are patterned on surface 42A Surface 42A has terminals P1, P2, P3, P4, P5 and P6 and a resistor R2. Terminals P4, P4A, P2 and P2A are connected to ground. The terminals are electrically connected to vias 60. The resistor R2 has a protective overglaze 70 to protect the resistor from abrasion and shorting. Layer 44 has a ground plane 63 formed on surface 44A. Ground plane 63 is connected on two sides to a via 60. Layer 48 has a ground plane 66 formed on surface 48A. The ground plane 66 is connected on two sides to a via 60. Layer 46 has a pair of capacitor electrodes 64 and 65 formed on surface 46A The capacitor electrodes 64 and 65 are each connected to separate vias. The capacitor electrodes 64 and 65, ground planes 63 and 66 and the insulative LTCC layers 44 and 46 in between form capacitors C2 and C3. Layer 50 has terminals P1A, P2A, P3A, P4A, and P6A located on bottom surface 50B.

The circuit features such as resistors, capacitor electrodes, vias and ground planes are formed by screening a thick film paste material and firing in an oven as is known in the art. First, the LTCC layers have via holes punched, the vias are then filled with a conductive material. Next, the circuit features are screened onto the layers. The terminals, ground planes and capacitor electrodes are formed with a conductive material. The layers are then aligned and stacked on top of each other to form LTCC substrate 40. The LTCC structure 40 is then fired in an oven at approximately 900 degrees centigrade to form a unitary piece. The resistor is formed with a resistor material, fired, and trimmed to a desired value. An insulative overglaze is screened over the resistor and fired. Next, the transformer T5 is glued above overglaze 70 using an epoxy 82. Wires 30A, 30B, 32A, 32B and 32C are welded to their respective terminals using welds 80.

The power splitter 21 would be mounted to a printed circuit board (not shown). Terminals P1A, P2A, P3A, P4A, and P6A on the bottom of surface 50B would be attached to the printed circuit board using a reflowed solder paste. The paste could be screened onto the terminals and then the splitter is set on the printed circuit board and reflowed in an oven.

The present invention has several advantages. Since, the resistor R2 and capacitors C2 and C3 are integrated into the LTCC structure, they do not have to be mounted separately on the printed circuit board. Further, the mounting of transformer T5 above the resistor and capacitor provides a compact, small package, that saves space on the printed circuit board and allows for a faster assembly process at lower cost.

Figure 6:
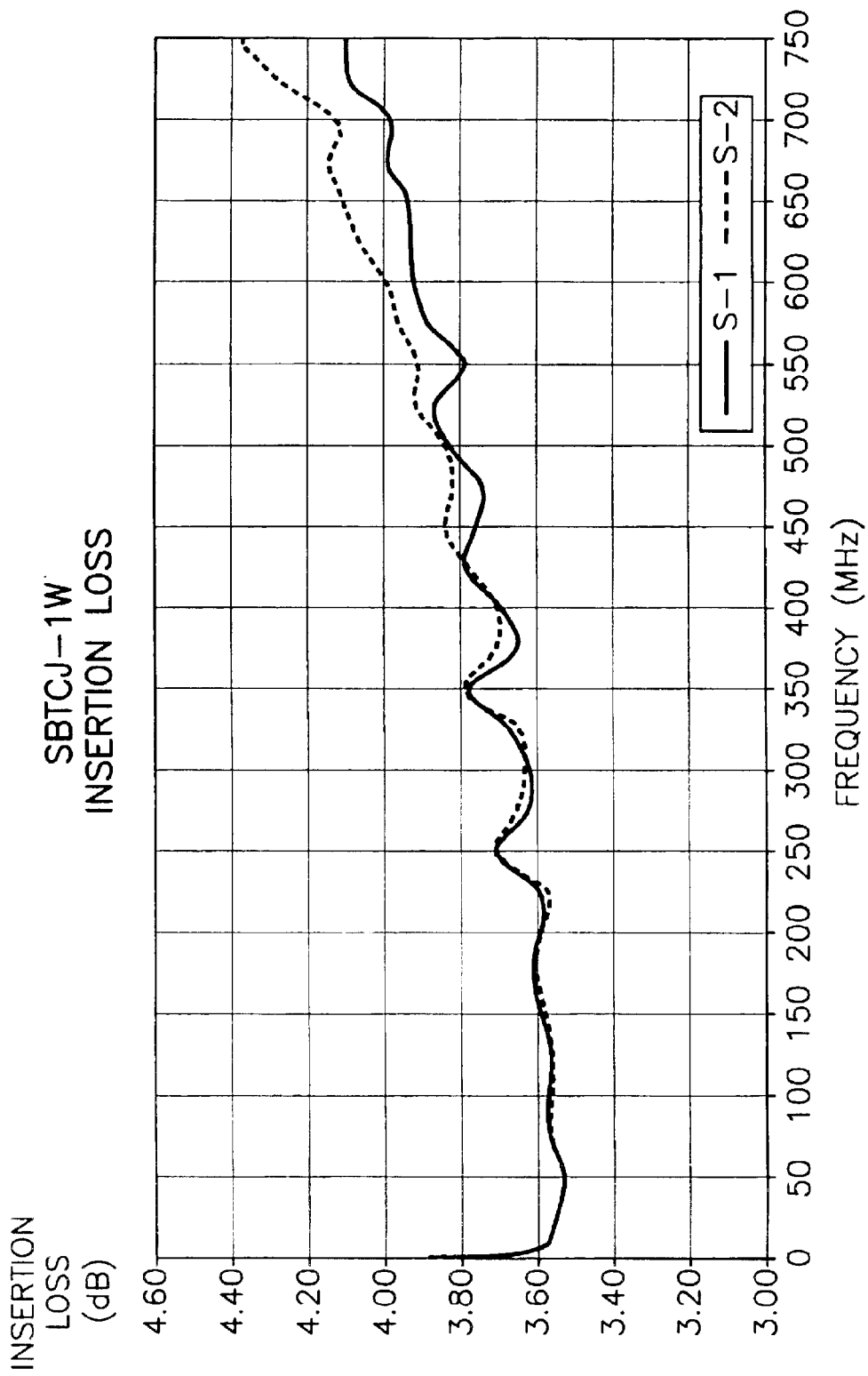
FIG. 6 is a graph showing insertion loss of the power splitter of FIG. 3.

Repeatability of electrical performance is a prime concern for electrical design engineers. Fabricating the power splitter using an LTCC process with the circuit of FIG. 2 results in a more uniform electrical performance in the resulting power splitter. Referring to FIG. 6, a graph showing S1 and S2 insertion loss for power splitter 21 is shown for frequencies from 0 to 750 MHz.

Figure 7:
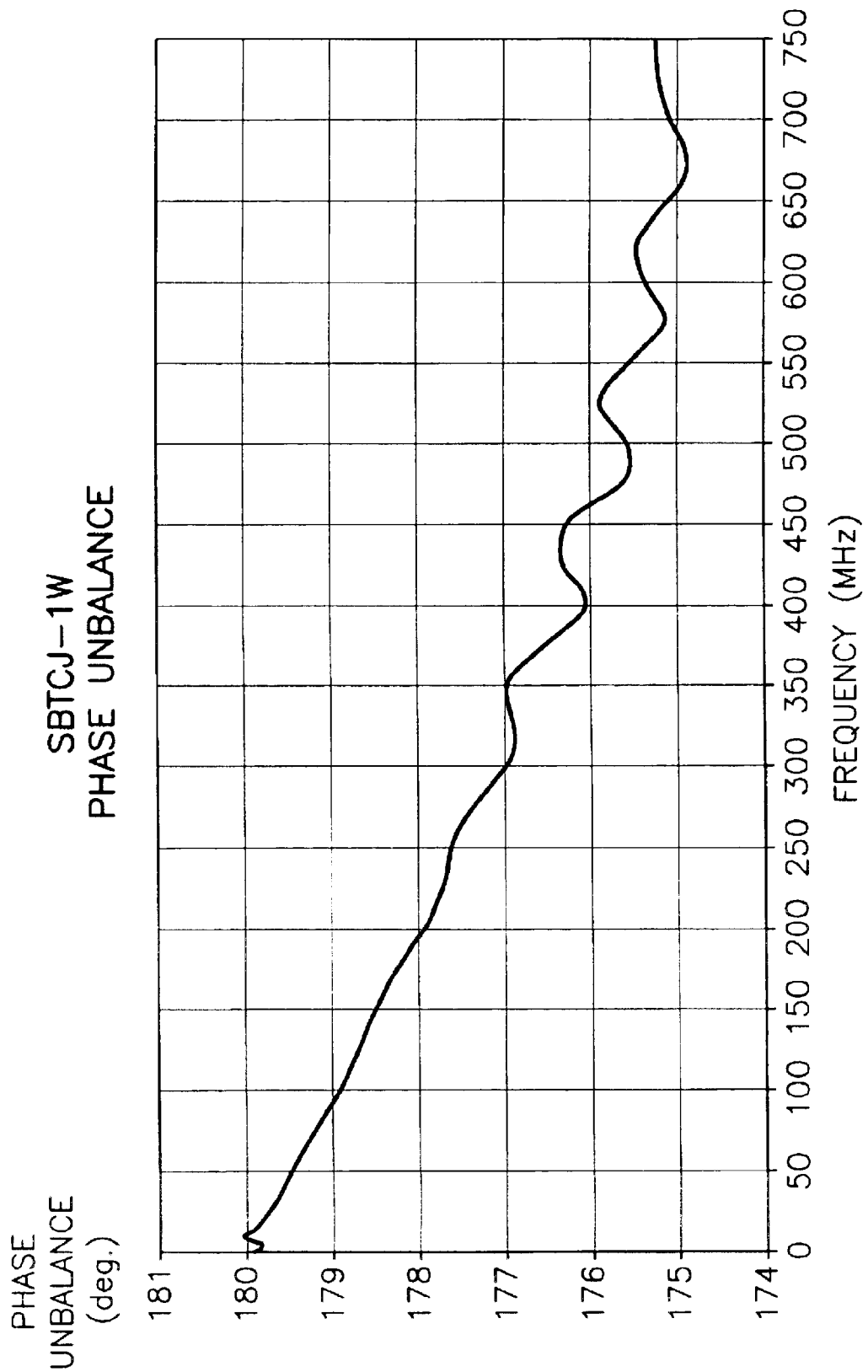
FIG. 7 is a graph showing phase unbalance of the power splitter of FIG. 3.
Figure 8:
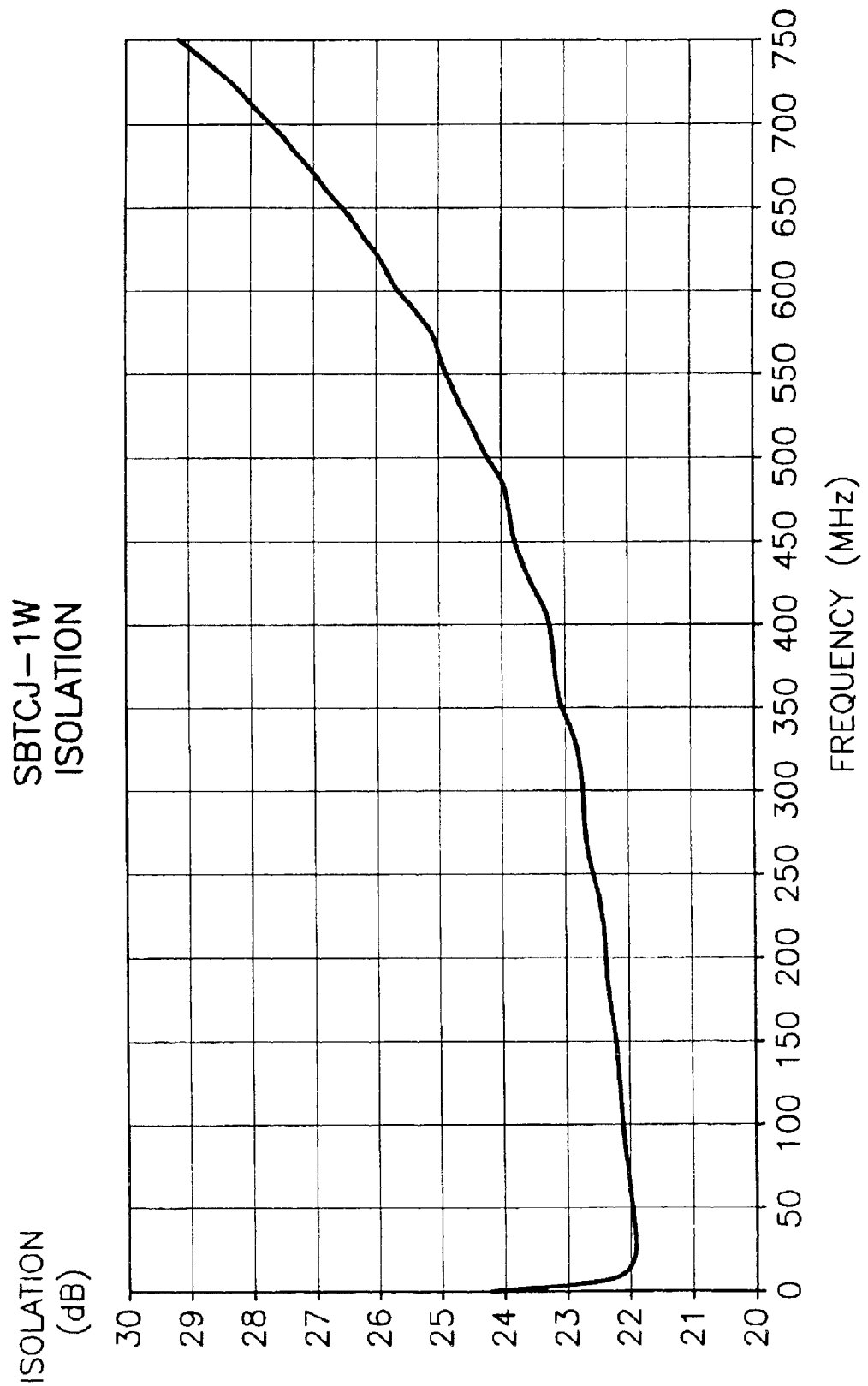
FIG. 8 is a graph showing isolation of the power splitter of FIG. 3.
Figure 9:
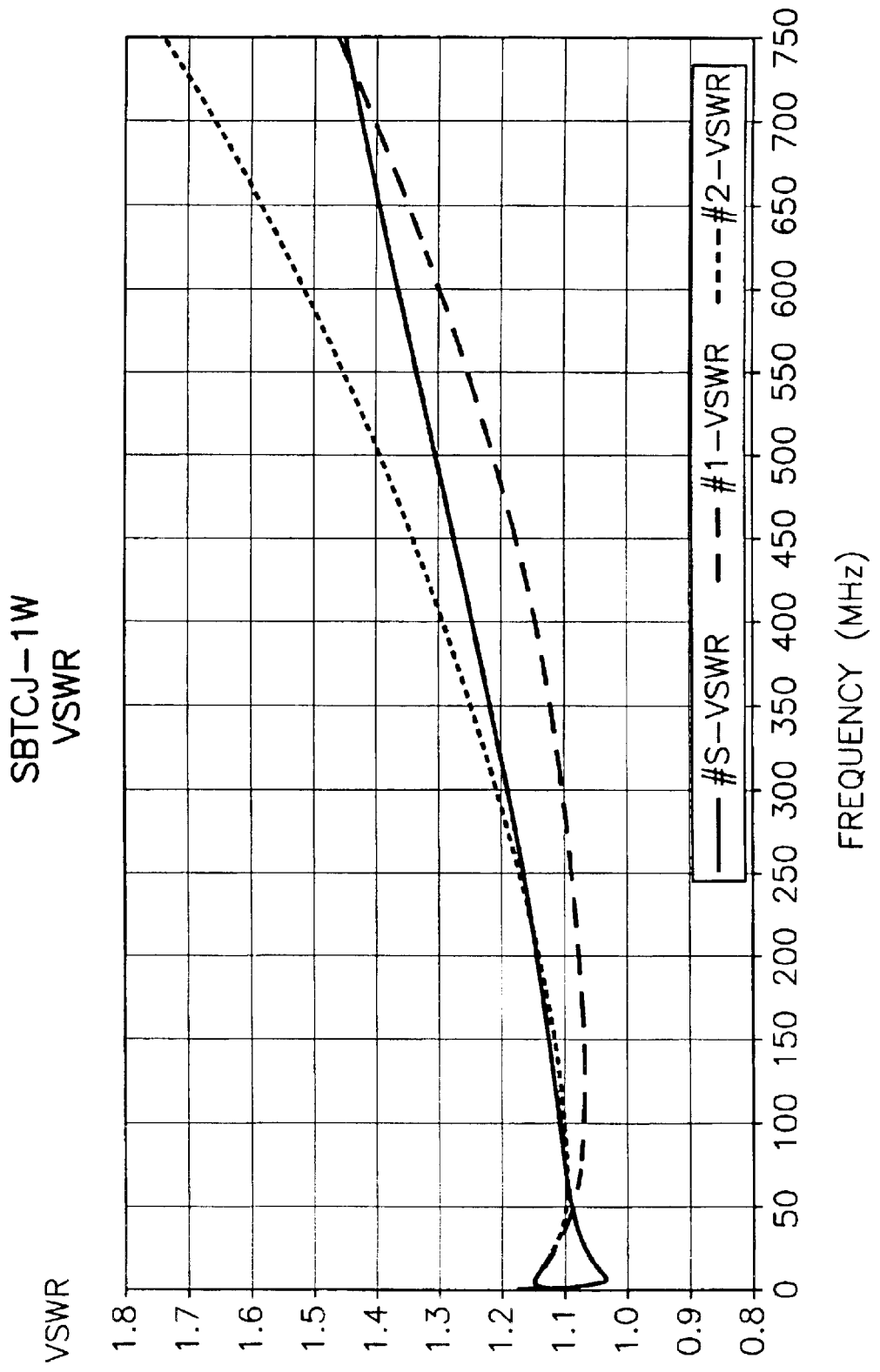
FIG. 9 is a graph showing VSWR of the power splitter of FIG. 3.

FIG. 7 is a graph showing the phase unbalance of the power splitter. FIG. 8 shows a graph of isolation of the power splitter between the output terminals P3 and P1 for 0 to 750 MHz. FIG. 9 is a graph showing VSWR at the input terminal P6 and output terminals P1 and P3 of the power splitter. The VSWR match is very good with a typical value of 1.25:1. The power splitter 21 is designed to operate over the frequency range of 1–750 MHz.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A power splitter comprising:
   a) a substrate having a plurality of layers, the substrate having a first and second surface;
   b) a resistor formed on the first surface;
   c) a ground plane formed on one of the layers;
   d) a first and second capacitor electrode located on one of the layers, the capacitor electrodes forming a first and second capacitor;
   e) a plurality of terminals located on the first and second surfaces;
   f) a binocular core transformer attached to the first surface, the binocular core transformer having a center leg, the transformer providing impedance matching and dividing;
   g) a first and second wire wound on the center leg, the first wire having a first end, a second end and a midpoint, the second wire having a third and fourth end, the first end connected to an input terminal, the third end connected to the first capacitor and a first output terminal, the fourth end connected to a second output terminal, the midpoint connected to a parallel combination of the resistor and the second capacitor, the parallel combination of the resistor and second capacitor further connected to ground; and
   h) a plurality of vias extending between the layers for providing electrical connections between the resistor, the capacitors, the terminals and the ground plane.

2. The power splitter according to claim 1 wherein the substrate is formed from layers of low temperature co-fired ceramic.

3. The power splitter according to claim 1 wherein the transformer is attached to the substrate using an epoxy.

4. The power splitter according to claim 1 wherein a first ground plane is located on a first layer and a second ground plane is located on a second layer.

5. The power splitter according to claim 4 wherein the first and second capacitor electrodes are located between the first and second ground planes.

6. A power splitter comprising:
   a) a multi-layered low temperature co-fired ceramic substrate, the substrate having a top surface, a bottom surface and a plurality of inner layers;
   b) a first set of terminals located on the top surface and a second set of terminals located on the bottom surface;
   c) a resistor formed on the top surface and connected between two of the terminals an overglaze covering the resistor;
   d) a first ground plane formed on one of the inner layers;
   e) a second ground plane formed on another inner layer;
   f) a first and second capacitor electrode located on another inner layer, the capacitor electrodes forming a first and second capacitor;
   g) a plurality of vias extending through the layers between the first and second set of terminals, the vias providing an electrical connection between the terminals, the resistor, the capacitors and the ground planes; and
   h) a transformer attached to the top surface over the overglaze, the transformer having a center leg, a first and second wire wound on the center leg, the first wire having a first end, a second end and a midpoint, the second wire having a third and fourth end, the first end connected to an input terminal, the third end connected to the first capacitor and a first output terminal, the fourth end connected to a second output terminal, the midpoint connected to a parallel combination of the resistor and the second capacitor, the parallel combination of the resistor and second capacitor further connected to ground.

7. The power splitter according to claim 6 wherein the transformer is attached to the overglaze with an epoxy.

8. The power splitter according to claim 6 wherein the first and second windings are electrically connected to the first set of terminals by a plurality of welds.

9. The power splitter according to claim 6 wherein the substrate is connected to a printed circuit board by a reflowed solder paste attached to the second set of terminals on the bottom surface.

10. A power splitter for splitting an input signal into two output signals comprising:
    a) a transformer having a binocular core with a center leg, a first and second wire wound on the center leg forming a first and second winding;
    b) the first wire having a first end and a second end, the first end connected to a ground terminal and the second end connected to an input terminal;
    c) the second wire having a third and fourth end and a mid-point, the third end connected to a first output terminal and the fourth end connected to a second output terminal;
    d) a resistor; and
    e) a first capacitor connected in parallel with the resistor, the parallel combination of the capacitor and resistor having one end connected to the mid-point and the other end connected to the ground terminal.

11. The power splitter according to claim 10 wherein, a second capacitor is connected between the third end and the ground terminal.

* * * * *